United States Patent [19]

Dikken

[11] Patent Number: 4,952,822
[45] Date of Patent: Aug. 28, 1990

[54] INTEGRATED LOGIC CIRCUIT WITH INSTABILITY DAMPING

[75] Inventor: Jan Dikken, Eindhoven, Netherlands

[73] Assignee: U.S. Philips Corporation, New York, N.Y.

[21] Appl. No.: 270,155

[22] Filed: Nov. 10, 1988

[30] Foreign Application Priority Data

Nov. 20, 1987 [NL] Netherlands .......................... 8702781

[51] Int. Cl.$^5$ ................... H03K 19/017; H03K 19/003
[52] U.S. Cl. ..................................... 307/443; 307/542; 307/550; 307/296.5; 307/262
[58] Field of Search ............... 307/443, 264, 451, 568, 307/540, 542, 448, 554, 568, 571, 572, 296.4, 296.5, 296.8, 548, 272.3, 304, 550, 262

[56] References Cited

U.S. PATENT DOCUMENTS

| 4,209,713 | 6/1980 | Satou et al. | 307/443 |
| 4,694,199 | 9/1987 | Goetz | 307/296.8 |
| 4,704,547 | 11/1987 | Kirsch | 307/443 |
| 4,710,726 | 12/1987 | Czarnul | 307/568 |
| 4,736,123 | 4/1988 | Miyazawa et al. | 307/443 |
| 4,771,189 | 9/1988 | Noufer | 307/443 |
| 4,791,323 | 12/1988 | Austin | 307/576 |

Primary Examiner—Timothy P. Callahan
Attorney, Agent, or Firm—Steven R. Biren

[57] ABSTRACT

In integrated logic circuits, at least one additional transistor may be provided in cascode connection with at least one other component in order to avoid detrimentally high electrical fields in components of such circuits. The control electrode is then connected to one of the power supply lines. When the state of the logic circuit changes, switching currents generate voltage peaks on the power supply lines due to the inductance of these lines. Via the chip capacitance these voltage peaks jump from one power supply line to the other. Thus, a positive feedback loop is formed which comprises one power supply line, the chip capacitance, the other power supply line and the additional transistor. Instabilities in such circuits are damped by inserting a resistance element between the control electrode of the additional transistor and the power supply line coupled thereto.

2 Claims, 1 Drawing Sheet

INTEGRATED LOGIC CIRCUIT WITH INSTABILITY DAMPING

BACKGROUND OF THE INVENTION

The invention relates to an integrated logic circuit having a first subcircuit which is connected between a first power supply line and an output of the circuit, and a second subcircuit which is connected between the output and a second power supply line, a current path of an additional transistor being connected at least between one of the subcircuits and the output in order to limit detrimentally high electrical fields in parts of one subcircuit, and a control electrode of the additional transistor being coupled only to the power supply line whereto the other subcircuit is connected.

A logic circuit of this kind is known from Netherlands Patent Application 8400523.

As the dimensions of transistors and other components of an integrated circuit become increasingly smaller, distances across which the full difference between the supply voltages is present also become increasingly smaller, resulting in high electrical field strengths. Such high field strengths, occurring notably in logic circuits in which the full power supply voltage is liable to occur across a single transistor, give rise to so-called hot-carrier stress and hot-carrier degradation effects in, for example field effect transistors. The high-energy free charge carriers accelerated by these fields collide with the crystal lattice of the substrate, thus releasing other charge carriers and causing substantial, unintended currents. The charge carriers dispersed to the interface between the substrate and the oxide due to the collisions will pass this interface when the energy is sufficiently high, so that they are intercepted by the oxide in which they cause an increased oxide load. Consequently, the switching characteristic of the transistor changes. The high field strengths in the transistor can also cause avalanche breakdown in a non-conductive pn-junction. As the dimensions of the transistor become smaller, the voltage across the pn junction at which this phenomenon occurs will be lower. In order to avoid such effects, in known logic circuits the current path of an additional transistor is included in a path between the output of the circuit and one of the power supply lines, a control electrode being connected to the other power supply line. The maximum voltage then occurring across the protected subcircuit is then reduced by a threshold voltage. However, the reduction of the dimensions of the parts of an integrated circuit also gives rise to another kind of problem. The switching occurring when the state of the logic circuit changes will cause induction voltages on the respective power supply lines, because these power supply lines have a substantial inductance. A pulse-shaped induction voltage pulse on one power supply line is transferred to the other power supply line via a capacitive coupling. The control electrode of the additional transistor in the known logic circuit will also receive this voltage pulse. A voltage pulse generated by a charging or discharging current is liable to circulate through a circuit loop which comprises, for example a part of one power supply line, the capacitive coupling, a part of the other power supply line and the control electrode of the additional transistor, giving rise to positive feedback which influences the charging or discharging current. Consequently, the output voltage of the logic circuit is liable to reach a stable value only after a delay; alternatively, instabilities may occur which cause increasingly larger current peaks. In a worst case situation such instabilities (oscillations) can damage the circuit.

SUMMARY OF THE INVENTION

It is an object of the invention to provide an integrated logic current in which such instabilities, caused by the presence of the additional transistor, are reduced.

To achieve this, an integrated logic circuit in accordance with the invention is characterized in that the control electrode is coupled to the relevant power supply line via a resistance element. The resistance element included in the positive feedback loop has a damping effect.

An embodiment of an integrated logic circuit in accordance with the invention is characterized in that the resistance element comprises a current path of a further transistor, a control voltage of the further transistor, being substantially equal to the difference between voltages on the respective power supply lines, the control voltage being a base-emitter voltage or a gate-source voltage, respectively, when the further transistor is a bipolar type or a field effect type, respectively. This results in a compact construction of a resistance element. Because the control voltage of the additional transistor is substantially constant, the further transistor behaves as an ohmic resistance.

BRIEF DESCRIPTION OF THE DRAWING

The invention will be described in detail hereinafter with reference to the drawing, in which.

DESCRIPTION OF THE PREFERRED EMBODIMENTS

Figure 1:
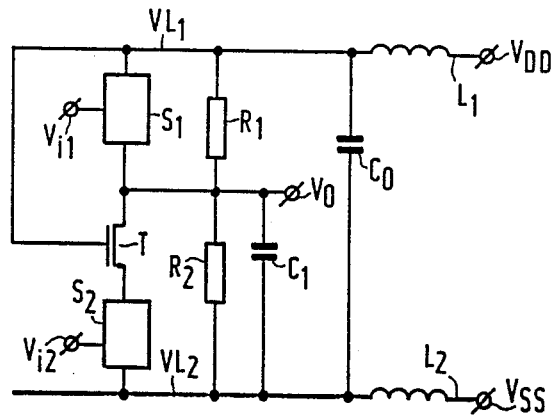
FIG. 1 shows a circuit diagram of a logic circuit according to the present state of the art.

FIG. 1 shows a circuit diagram of a known logic circuit. Between power supply lines VL1 and VL2 there is connected a logic circuit which comprises, connected between the power supply line VL1 and the output of the circuit Vo, a first subcircuit S1 which comprises an input Vi1, and, connected between the output Vo and the power supply line VL2, a second subcircuit S2 which comprises an input Vi2. To the output Vo there is connected a load embodied in the resistances R1 and R2 and the capacitance C1. The transistor T is connected between the output Vo and the subcircuit S2, its control electrode being connected to the power supply line VL1, and protects the subcircuit S2 when the output Vo is logic high. The voltage then arising across the subcircuit S2 at the most equals the supply voltage $V_{DD}-V_{SS}$, minus a threshold voltage of the transistor T. When current is dissipated by the subcircuit S2 in the steady state, the maximum voltage across S2 is even lower. When t he output Vo is discharged across the subcircuit S2, a voltage pulse arises on the power supply line VL2 because the supply line has an inductance L2. The power supply lines VL1 and VL2 are capacitively coupled by means of a parasitic capacitance Co which is also referred to as the chip capacitance. Via the chip capacitance Co, the voltage pulse reaches the power supply line VL1 and hence the control electrode of the transistor T which thus draws more current. This current increase through the subcircuit S2 generates a next voltage pulse which circulates through the same loop.

Figure 2:
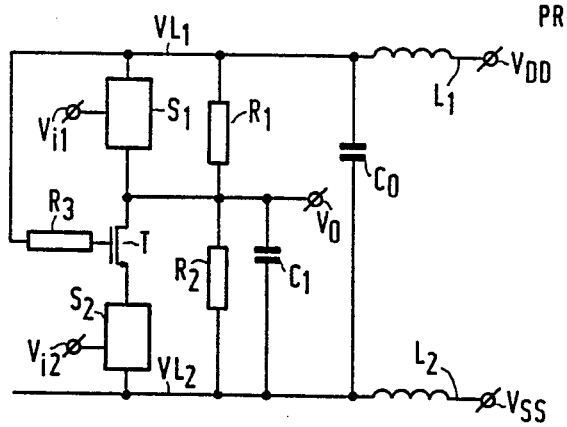
FIG. 2 shows a circuit diagram of a first logic circuit in accordance with the invention.

FIG. 2 shows a circuit diagram of a logic circuit in accordance with the invention. The components which correspond to FIG. 1 are denoted by corresponding references. In the connection between the control electrode of the additional transistor T and the power supply line VL1 there is included a resistance R. This resistance R has a damping effect on instabilities in the positive feedback loop wherethrough the voltage pulse circulates as described above.

Figure 3:
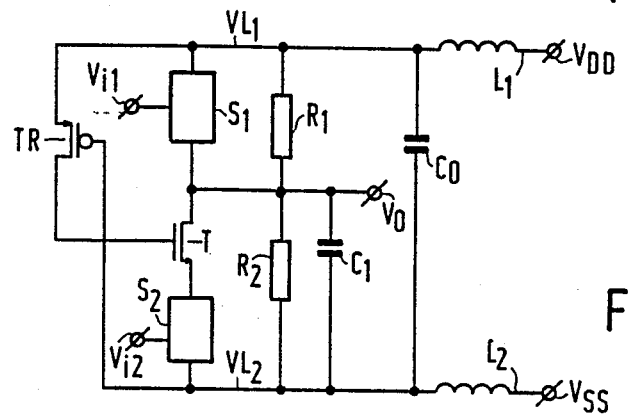
FIG. 3 shows a circuit diagram of a second logic circuit in accordance with the invention.

FIG. 3 shows a second circuit diagram of a logic circuit in accordance with the invention. As in the preceding Figure., the elements corresponding to FIG. 1 are denoted by corresponding references. The resistance element now comprises the transistor TR in the connection between the power supply line VL1 and the control electrode of the transistor T. The transistor TR is chosen so that its control voltage is equal to the voltage difference between the power supply lines VL1 and VL2. The supply voltage does not change when the same pulse occurs on both power supply lines. In a linear approximation, a current through the transistor TR then varies in proportion to the magnitude of the voltage pulse on the power supply line VL1. An ohmic resistance is thus realized.

Even though the transistors shown in the drawing are of the field effect type, the invention is by no means restricted to such a type of transistor. Moreover, the use of the additional transistor is not restricted to the position shown in the drawing.

What is claimed is:

1. An integrated logical circuit, comprising a first subcircuit coupled between a first supply line and a circuit output, a second sub-circuit coupled between the circuit output and a second supply line, whereby at least between one of the subcircuits and the circuit output a current conduction path of an additional transistor is placed for reducing electrical fields in parts of the respective subcircuit, a control electrode of said additional transistor being coupled solely to the supply to which the other of the subcircuits is coupled, characterized in that said control electrode is coupled to said one supply line via a resistive element.

2. An integrated logic circuit as claimed in claim 1, characterized in that the resistive element comprises a current path of a further transistor, a control voltage of the further transistor being substantially equal to the difference between voltages on the respective power supply lines.

* * * * *